United States Patent [19]
McDonald et al.

[11] Patent Number: 6,031,741
[45] Date of Patent: Feb. 29, 2000

[54] MULTIPLYING CIRCUIT UTILIZING INVERTERS

[75] Inventors: Adrian McDonald, Somerset; Richard James Caswell, Fairford, both of United Kingdom

[73] Assignee: Telefonaktiebolaget LM Ericsson, Stockholm, Sweden

[21] Appl. No.: 09/217,404

[22] Filed: Dec. 21, 1998

[30] Foreign Application Priority Data

Dec. 24, 1997 [GB] United Kingdom ............... 9727271

[51] Int. Cl.⁷ .................................................. H02M 3/18
[52] U.S. Cl. ............................................ 363/60; 363/59
[58] Field of Search ............................. 363/59, 60, 61

[56] References Cited

U.S. PATENT DOCUMENTS

| | | | |
|---|---|---|---|
| 4,982,317 | 1/1991 | Mauthe | 363/60 |
| 5,397,931 | 3/1995 | Bayer | 363/59 |
| 5,594,380 | 1/1997 | Nam | 327/390 |
| 5,757,632 | 5/1998 | Beppu et al. | 363/60 |

FOREIGN PATENT DOCUMENTS

| | | |
|---|---|---|
| 0557080 A1 | 8/1993 | European Pat. Off. . |
| 0703670 A2 | 3/1996 | European Pat. Off. . |
| 195 15789 A1 | 11/1995 | Germany . |

*Primary Examiner*—Peter S. Wong
*Assistant Examiner*—Gary Laxton
*Attorney, Agent, or Firm*—Jenkens & Gilchrist, P.C.

[57] ABSTRACT

A voltage doubling circuit provides an output voltage, for supply to a capacitive load, which is nearly double the positive supply voltage. During one phase of a clock signal, a capacitor is charged so that the positive supply voltage appears on one terminal and the negative supply voltage appears on the other terminal thereof while, during the other phase of the clock signal, the terminal formerly held at the negative supply voltage is clamped to the positive supply voltage, and the output increases to nearly double the positive supply.

5 Claims, 1 Drawing Sheet

MULTIPLYING CIRCUIT UTILIZING INVERTERS

TECHNICAL FIELD OF THE INVENTION

This invention relates to an electronic circuit, and in particular to a circuit for providing an output voltage which can be greater than a positive supply voltage applied thereto. The output voltage can be supplied to a control terminal of a transistor, to ensure that it switches fully on and off, even when there is only a low supply voltage available.

BACKGROUND OF THE INVENTION

MOS transistors are commonly used in analog integrated circuits as switches. That is, the circuit designs use these devices in two states, namely "on" and "off". In order to turn the devices on, the gate-source voltage of the transistor must be sufficiently high to ensure that the device is fully on, and hence that the source-drain impedance is low enough to provide adequate performance. However, in a circuit with a relatively low supply voltage, for example in a battery-powered device, in which it is considered desirable to reduce the number and size of batteries which are used, it can be difficult to provide a sufficiently high gate-source voltage. This can advantageously be achieved by providing a gate voltage which is higher than the positive supply voltage of the circuit.

EP-A-0589123 discloses a voltage doubling circuit, which provides an output voltage which is in phase with an input clock signal, but which relies on a diode to charge a capacitor. The presence of the diode results in a voltage drop across the diode.

SUMMARY OF THE INVENTION

The present invention relates to a circuit which, in preferred embodiments, provides an output voltage which is approximately double the positive supply voltage of the circuit. A capacitor is charged during one phase of a clock cycle to a voltage equivalent to the difference between the positive and negative supply voltages and, during a second phase of an input clock signal, the charge on the capacitor is shared with the load, while the terminal formerly held at the negative supply voltage is instead clamped to the positive supply voltage. By appropriate selection of the capacitance value of the capacitor, the voltage applied to the load can be made to be nearly double the positive supply voltage.

DETAILED DESCRIPTION OF PREFERRED EMBODIMENTS

Figure 1:
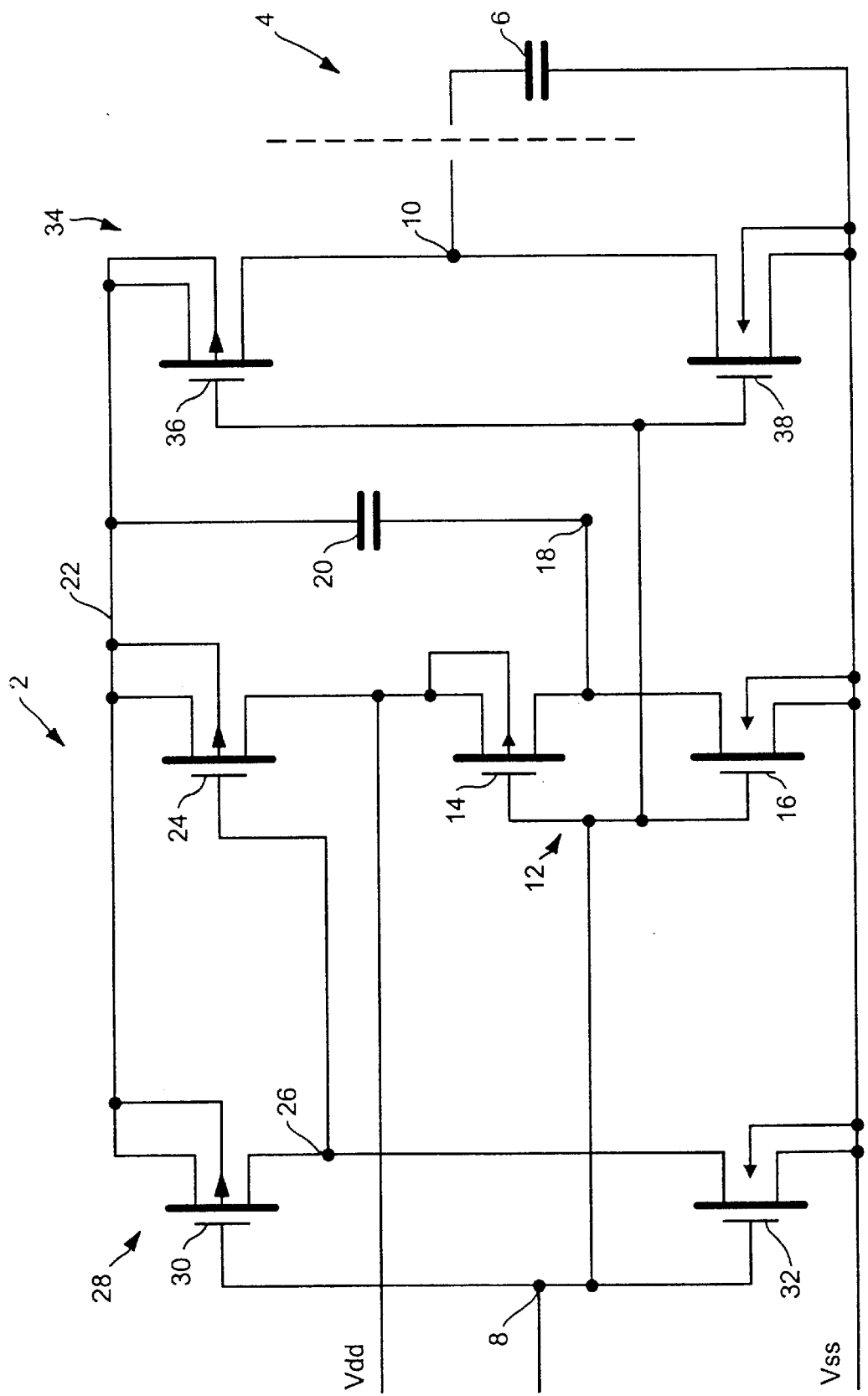
FIG. 1 is a schematic circuit diagram of a circuit in accordance with the invention.

FIG. 1 shows a voltage doubling circuit 2, supplying a capacitive load 4, which is represented schematically by a capacitor 6. For example, the load 4 may be the gate of a NMOS switch, in a circuit in which it is necessary to provide a voltage higher than the circuit positive supply voltage, in order to ensure that the switch is turned fully on. The circuit shown in FIG. 1 uses enhancement mode MOS devices.

The voltage doubling driver circuit 2 is connected to the circuit positive supply voltage Vdd and the circuit negative supply voltage Vss. The circuit is driven by a clock signal supplied to an input terminal 8, and provides its output voltage to the load 4 at an output terminal 10. It is desired to provide an output voltage in phase with the input clock signal.

The voltage doubling driver circuit 2 includes an inverter 12 made up of a first PMOS transistor 14 and a first NMOS transistor 16. The first PMOS transistor 14 has its gate connected to the input node 8, its source connected to the positive supply voltage Vdd, and its drain connected to the first inverter output terminal 18. The first NMOS transistor 16 has its gate connected to the input node 8, source connected to the circuit negative supply voltage Vss, and drain connected to the first inverter output terminal 18.

A capacitor 20 is connected between the first inverter output terminal 18, and an oversupply rail 22, which, during one phase of the input, is at a voltage higher than the positive supply rail Vdd.

A second PMOS transistor 24 has its source connected to the oversupply rail 22, and its drain connected to the positive supply voltage Vdd. The gate of the second PMOS transistor 24 is connected to the output terminal 26 of a second inverter 28, made up of a third PMOS transistor 30 and second NMOS transistor 32. The third PMOS transistor 30 has its gate connected to the input node 8, source connected to the oversupply rail 22 (which thus acts as the positive supply for the second inverter), and drain connected to the second inverter output terminal 26. The second NMOS transistor 32 has its gate connected to the input node 8, source connected to the negative supply voltage Vss, and drain connected to the second inverter output terminal 26.

The oversupply rail 22 is also used as the positive supply for a third inverter 34, preferably made up of a fourth PMOS transistor 36 and third NMOS transistor 38, although it should be noted that one of these transistors may be replaced by a resistor. The fourth PMOS transistor 36 has its gate connected to the circuit input node 8, source connected to the oversupply rail 22, and drain connected to the circuit output node 10. The third NMOS transistor 38 has its gate connected to the circuit input node 8, source connected to the negative supply voltage Vss, and drain connected to the circuit output node 10.

Since the source terminals of the second PMOS transistor 24, third PMOS transistor 30 and fourth PMOS transistor 36 are all connected to the oversupply voltage rail 22, the bodies of these transistors must also be connected thereto, as shown in FIG. 1, to ensure that the source terminals do not become more positive than the bodies. However, since the first PMOS transistor 14 has its source connected to the positive voltage supply Vdd, it is sufficient to connect the body thereof to that voltage also.

A clock signal is applied to the circuit input node 8.

The operation of the circuit is that, when the input node 8 is high, that is, at the circuit positive supply voltage Vdd, the first inverter 12 acts to apply the circuit negative supply voltage Vss to the first inverter output terminal 18 through the first NMOS transistor 16.

At the same time, the second inverter 28 acts to apply a low voltage Vss to the gate of the second PMOS transistor 24, by turning the third NMOS transistor 32 on, and thus turns the second PMOS transistor 24 on. The oversupply rail 22 is therefore clamped by the second PMOS transistor 24 to the circuit positive supply voltage Vdd.

The voltage across the capacitor 20 is therefore equal to (Vdd-Vss).

During the other phase of the input signal, when the input node 8 is held low, that is at the circuit negative supply voltage Vss, the first PMOS transistor 14 is switched on, as the first inverter 12 acts to connect the first inverter output terminal 18 to the circuit positive supply voltage Vdd.

Similarly, the fourth PMOS transistor 36 is turned on, and the third inverter 34 acts to connect the circuit output node 10 to the oversupply rail 22, and hence to the other side of the capacitor 20. The voltage level at the circuit output node 10 is therefore set by charge sharing between the capacitor 20 and the load 4 which, as discussed above, must be purely capacitive for the circuit to operate effectively. In effect, some of the charge on capacitor 20, determined by the voltage (Vdd-Vss) in the first phase of the input cycle, leaks to the load 4. However, provided that the capacitor 20 is chosen to have a capacitance value which is significantly larger than that of the load 4, the amount of leakage is small, and the majority of the charge remains on the capacitor 20. As a result, the voltage drop across the capacitor 20 remains relatively constant. As a result, since the voltage at the node 18 is now equal to Vdd, the voltage at the oversupply rail 22, and hence at the circuit output node 10, increases to (2.Vdd-Vss), that is, approximately twice the positive supply voltage Vdd above the negative supply voltage Vss.

During the second phase of the cycle of the input signal, the second PMOS transistor 24 is held off by the second inverter 28, which is supplied by the oversupply rail 22.

There is thus provided a circuit which supplies an output voltage which is approximately double the circuit positive supply voltage, in phase with an input clock signal.

Although the circuit has been described herein with reference to an N-well process, it will be appreciated that a P-well CMOS process could equally be used, with the NMOS transistors 16, 32, 38 being replaced by PMOS transistors, and the PMOS transistors 14, 24, 30, 36 being replaced by NMOS transistors, and with the polarities of the supply voltages reversed, in order to provide an output voltage which is lower than the circuit negative supply voltage Vss.

Moreover, although the circuit has been described herein as made from CMOS devices, it will be appreciated that a bipolar or BiCMOS version could be used, with any combination of pFET or PNP transistors replacing illustrated PMOS devices, and nFET or NPN replacing illustrated NMOS devices.

There is thus provided a voltage doubling circuit which provides an output voltage higher than the circuit positive supply, in phase with an input clock signal.

We claim:

1. A driver circuit, comprising:

a circuit input;

a first inverter, comprising first and second MOS transistors connected between first and second power supply rails, and having the gates of the first and second transistors connected to the circuit input and a first inverter output terminal connected to the drains of the first and second MOS transistors;

a capacitor, connected between the inverter output terminal and a first node;

a second inverter, comprising third and fourth MOS transistors connected between the first power supply rail and the first node, and having the gates of the third and fourth MOS transistors connected to the circuit input and a second inverter output terminal connected to the drains of the third and fourth MOS transistors;

a fifth MOS transistor, having its gate connected to the second inverter output terminal, and having its conducting channel connected between the second power supply rail and the first node; and a third inverter, connected between the first power supply rail and the first node, and having a third inverter input terminal connected to the circuit input and a third inverter output terminal acting as the circuit output.

2. A driver circuit as claimed in claim 1, wherein the third inverter comprises sixth and seventh MOS transistors, wherein the gates of the sixth and seventh MOS transistors act as the third inverter input terminal, and the drains of the sixth and seventh MOS transistors act as the third inverter output terminal.

3. A driver circuit as claimed in claim 1, having a capacitive load connected between the first power supply rail and the circuit output.

4. A driver circuit as claimed in claim 1, having means for supplying a clock signal to said circuit input.

5. A driver circuit as claimed in claim 1, wherein said fifth MOS transistor is a PMOS transistor, having its drain connected to the second power supply rail and its source connected to said first node.

* * * * *